(12) United States Patent
Hayashi et al.

(10) Patent No.: US 7,393,554 B2
(45) Date of Patent: Jul. 1, 2008

(54) METHOD AND APPARATUS FOR MANUFACTURING FLEXIBLE-TYPE LUMINESCENT DEVICE

(75) Inventors: Kazuhiko Hayashi, Tokyo (JP); Setsuo Kaneko, Tokyo (JP)

(73) Assignee: Samsung SDI Co., Ltd., Suwon (KR)

( * ) Notice: Subject to any disclaimer, the term of this patent is extended or adjusted under 35 U.S.C. 154(b) by 525 days.

(21) Appl. No.: 10/277,840

(22) Filed: Oct. 22, 2002

(65) Prior Publication Data

US 2003/0082984 A1 May 1, 2003

(30) Foreign Application Priority Data

Oct. 25, 2001 (JP) .............................. 2001-327616

(51) Int. Cl.
 *B05D 5/06* (2006.01)
(52) U.S. Cl. .............................. 427/66; 427/64; 427/69; 427/117; 427/156; 427/282; 427/421.1
(58) Field of Classification Search ................... 427/66, 427/68, 64, 69, 117, 156, 282, 421.1
See application file for complete search history.

(56) References Cited

U.S. PATENT DOCUMENTS

| 5,904,961 | A * | 5/1999 | Tang et al. ................... 427/561 |
| 6,194,090 | B1 * | 2/2001 | Okada ......................... 428/690 |
| 6,337,102 | B1 * | 1/2002 | Forrest et al. ................. 427/64 |
| 6,579,422 | B1 * | 6/2003 | Kakinuma ............. 204/192.13 |
| 2002/0017245 | A1 * | 2/2002 | Tsubaki et al. ............... 118/718 |

FOREIGN PATENT DOCUMENTS

| JP | 61018275 | 1/1986 |
| JP | 62-191197 | 12/1987 |
| JP | 8-96954 | 4/1996 |
| JP | 11083865 | 3/1999 |
| JP | 2000516761 | 12/2000 |
| JP | 2001-059161 | 3/2001 |
| JP | 2001-267068 | 9/2001 |
| JP | 2001256362 | 9/2001 |
| JP | 2001-272968 | 10/2001 |
| JP | 2001-284047 | 10/2001 |
| WO | 9925894 | 5/1999 |

(Continued)

OTHER PUBLICATIONS

C. W. Tang et al., "*Organic electroluminescent diodes*", pp. 913-915, Applied Physics Lett. 51(12), pp. 913-915, Sep. 21, 1987.

(Continued)

*Primary Examiner*—Timothy Meeks
*Assistant Examiner*—James Lin
(74) *Attorney, Agent, or Firm*—H.C. Park & Associates, PLC

(57) ABSTRACT

In a method for manufacturing a flexible-type luminescent device, a flexible body is supplied from a flexible body supplying section to a luminescent material pattern forming section. Then, a luminescent material pattern is formed on the flexible body in the luminescent material pattern forming section. Finally, the flexible body is fed from the luminescent material pattern forming section to a flexible body receiving section.

9 Claims, 12 Drawing Sheets

FOREIGN PATENT DOCUMENTS

WO        2000150150        5/2000

OTHER PUBLICATIONS

D. R. Baigent et al., "*Conjugated polymer light-emitting diodes on silicon substrates*", pp. 2636-2638, Applied Physics Lett. 65(21), Nov. 21, 1994.

Seizo Miyata, "*Organic EL Element and its Industrial Frontier*", English abstract of pp. 172-173, Nov. 1998.

Seizo Miyata, "*Organic EL Element and its Industrial Frontier*", English abstract of pp. 186-187, Nov. 1998.

* cited by examiner

METHOD AND APPARATUS FOR MANUFACTURING FLEXIBLE-TYPE LUMINESCENT DEVICE

BACKGROUND OF THE INVENTION

1. Field of the Invention

The present invention to a method and apparatus for manufacturing a luminescent device such as a flexible-type organic electroluminescent device.

2. Description of the Related Art

Electroluminescent devices are divided into organic electroluminescent devices using organic material as light-emitting layers and inorganic electroluminescent devices using inorganic material as light-emitting layers.

An organic electroluminescent device is a light emitting device which makes use of a principle that when an electric field is applied to a charge combination of holes from an anode and electrons from a cathode, the holes and the electrons are injected into an organic electroluminescent layer and are recombined with each other to generate energy which excites molecules in the organic electroluminescent layer. When the molecules are returned from an excited state to a ground state, light is emitted from the organic electroluminescent layer. Such an organic electroluminescent device has been developed ever since C. W. Tang et al. published "Organic Electroluminescent Diodes", Applied Physics Lett. 51(12), pp. 913-915, Sep. 21, 1987.

A first prior art organic electroluminescent device is constructed by a transparent insulating substrate, a striped transparent lower electrodes (anodes) made of indium tin oxide (ITO), for example, formed on the transparent insulating substrate, a light emitting layer formed on the lower electrodes, and striped upper electrodes (cathodes) formed on the light emitting layer. As occasion demands, a hole-injecting and-transporting layer is interposed between the lower electrodes and the light emitting layer, and an electron-injecting and-transporting layer is interposed between the light emitting layer and the upper electrodes, thereby to enhance the injection efficiency of carriers such as holes and electrons into the light emitting layer. As a result, light emitted from the light emitting layer is emitted from the bottom side of the device (see: the above-mentioned document).

A second prior art organic electroluminescent device is constructed by an insulating substrate, striped lower electrodes (anodes) formed on the insulating substrate, a light emitting layer formed on the lower electrodes, and striped transparent upper electrodes (cathodes) on the light emitting layer. Also in this case, a hole-injecting and-transporting layer can be interposed between the lower electrodes and the light emitting layer, and an electron-injecting and-transporting layer can be interposed between the light emitting layer and the upper electrodes. As a result, light emitted from the light emitting layer is emitted from the upper side of the device (see: D. R. Baigent et al., "Conjugated Polymer Light-emitting Diodes on Silicon Substrates", Applied Physics Lett. 65(21), pp. 2636-2638, Nov. 21, 1994).

The light emitting layer, the hole-injecting and-transporting layer and the electron-injecting and-transporting layer are made of organic materials. Therefore, an organic electroluminescent layer is constructed by a single organic structure or a stacked organic structure formed by a light emitting layer, a hole-injecting and-transporting layer and an electron-injecting and-transporting layer.

The above-mentioned organic electroluminescent layer is formed by a vacuum evaporation method or an ink jet method.

In the vacuum evaporation method, a shadow mask having fine holes is placed on a substrate having lower electrodes, and then, organic material is evaporated thereon. Then, the shadow mask is removed to leave an organic material pattern on the substrate (see: S. Miyata, "Organic EL Element and its Industrial Frontier", pp. 172-173, November, 1998). This vacuum evaporation method is suitable for organic material having a low molecular weight.

In the ink jet method, organic material immersed into solvent is ejected from nozzles on a substrate having lower electrodes, and then, the solvent is removed to leave an organic material pattern on the substrate (see: S. Miyata, "Organic EL Element and its Industrial Frontier", pp. 185-186, November 1998). This ink jet method is suitable for organic material having a high molecular weight as well as organic material having a low molecular weight.

The above-described organic electroluminescent device having a solid type substrate such as a glass substrate is applied to display units of a personal computer, a television set and the like; however, organic electroluminescent devices having a flexible substrate have recently been developed (see: JP-A-8-96954). Such organic electroluminescent devices have an advantage in that the devices can be adhered to curved faces and have an excellent substitute for paper.

However, no methods and apparatuses for manufactucturing such flexible-type organic electroluminescent devices have ever been disclosed.

SUMMARY OF THE INVENTION

It is an object of the present invention to provide a novel method and apparatus for manufacturing a flexible-type electroluminescent device.

According to the present invention, in a method for manufacturing a flexible-type luminescent device, a flexible body is supplied from a flexible body supplying section to a luminescent material pattern forming section. Then, a luminescent material pattern is formed on the flexible body in the luminescent material pattern forming section. Finally, the flexible body is fed from the luminescent material pattern forming section to a flexible body receiving section.

BRIEF DESCRIPTION OF THE DRAWINGS

The present invention will be more clearly understood from the description set forth below, with reference to the accompanying drawings, wherein.

DESCRIPTION OF THE PREFERRED EMBODIMENTS

Figure 1:
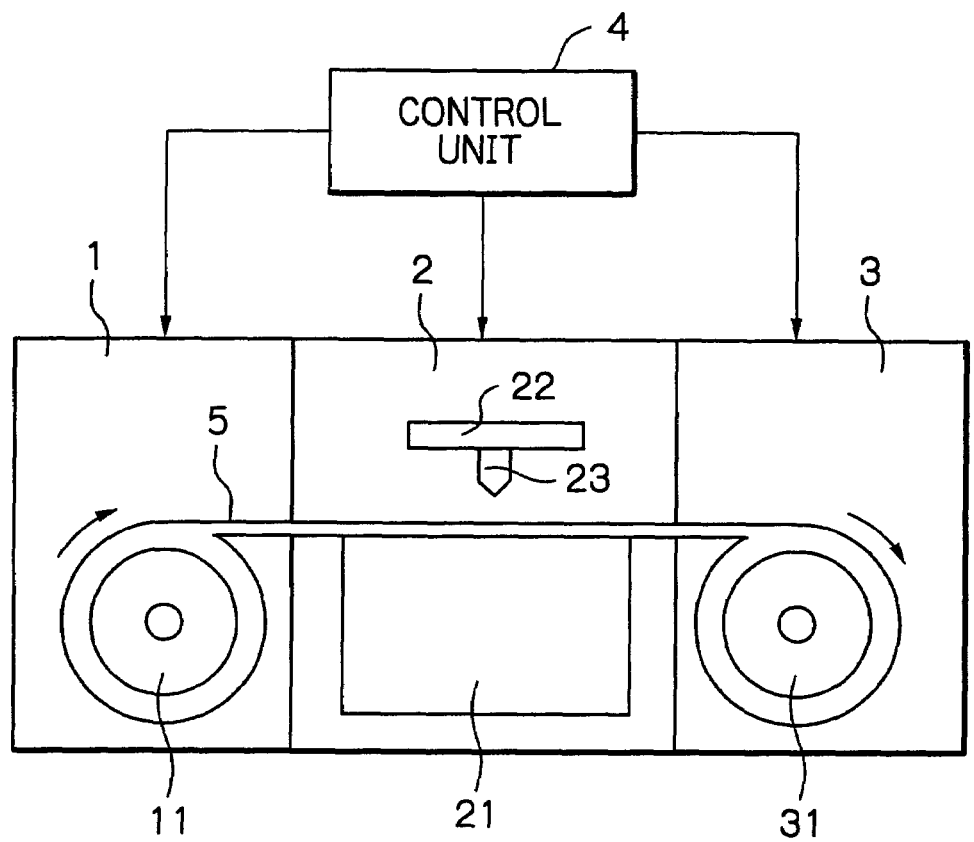
FIG. 1 is a cross-sectional view illustrating a first embodiment of the apparatus for manufacturing a flexible-type organic electroluminescent device according to the present invention.
Figure 2:
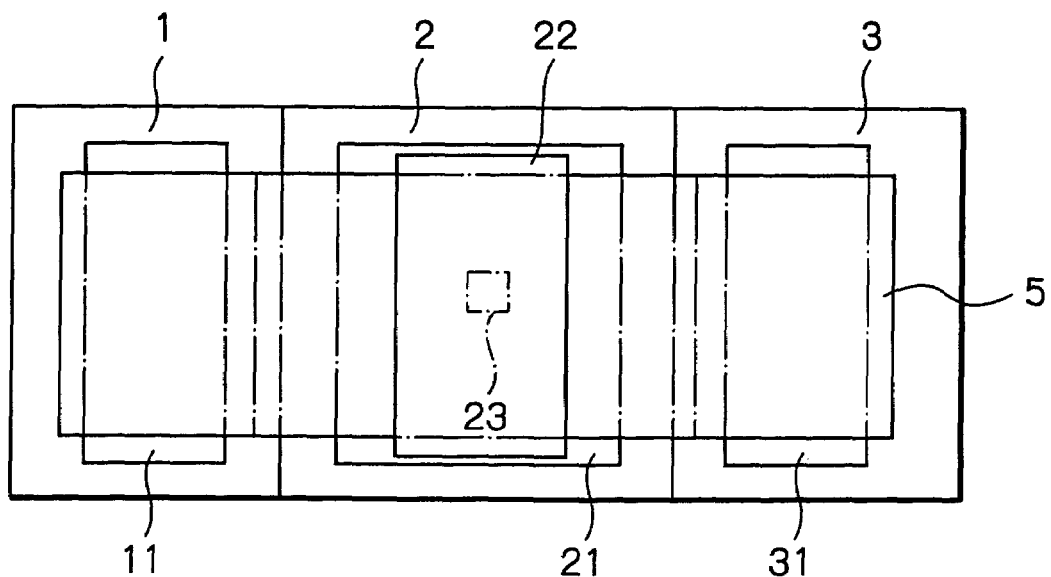
FIG. 2 is a plan view of the apparatus of FIG. 1.

FIG. 1 is a cross-sectional view illustrating a first embodiment of the apparatus for manufacturing a flexible-type organic electroluminescent device according to the present invention, and FIG. 2 is a plan view of the apparatus of FIG. 1.

In FIGS. 1 and 2, reference numeral 1 designates a flexible body supplying section, 2 designates an organic material pattern forming section, 3 designates a flexible body receiving section, and 4 designates a control unit for controlling the flexible body supplying section 1, the organic material pattern forming section 2 and the flexible body receiving section 3.

The flexible body supplying section 1 is constructed by a roll 11 which is driven by a motor (not shown) controlled by the control unit 4.

The organic material pattern forming section 2 is of an ink jet type constructed by a fixed stage 21, an X-Y stage 22 and an ink jet type head 23 fixed to the X-Y stage 22. The location of the X-Y stage 22 and the operation of the ink jet type head 23 are controlled by the control unit 4.

The flexible body receiving section 3 is constructed by a roll 31 which is driven by a motor (not shown) controlled by the control unit 4.

A flexible body 5 is wound on the roll 11, and then, the flexible body 5 is fed from the roll 11 via the fixed stage 21 to the roll 31.

Figure 3:
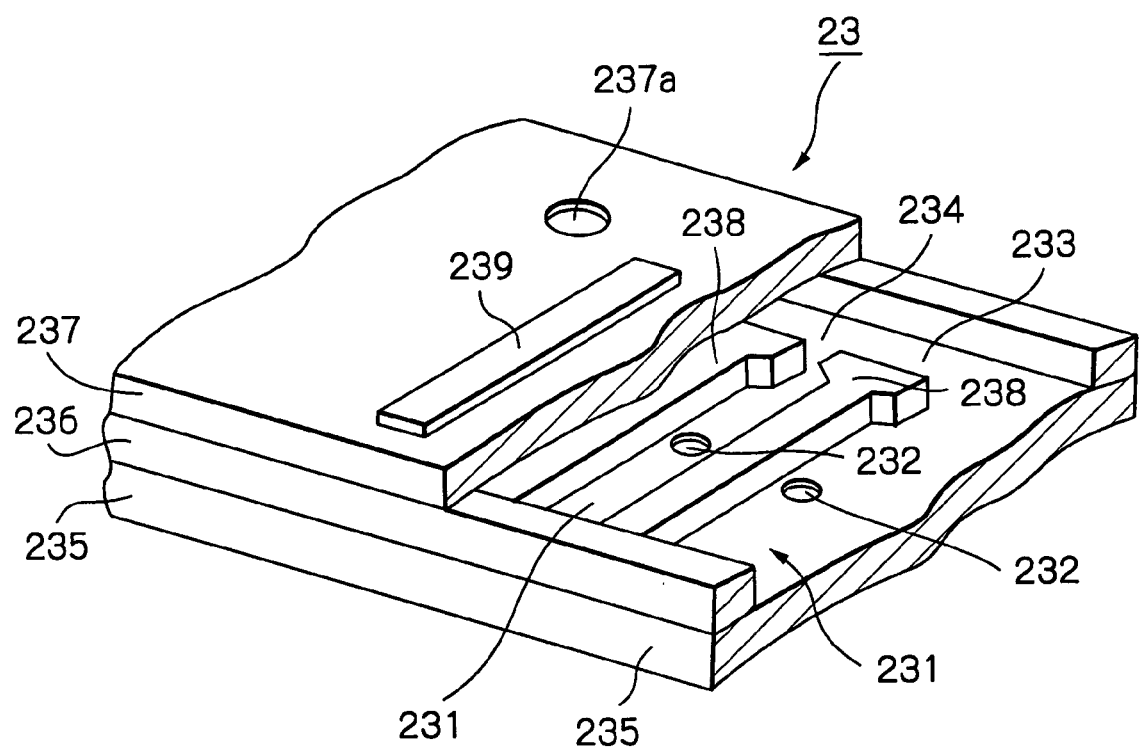
FIG. 3 is a partly-cut perspective view of the ink jet type head of FIGS. 1 and 2.

In FIG. 3, which is a partly-cut perspective view of the ink jet type head 23 of FIGS. 1 and 2, a plurality of pressure chambers 231 linked to nozzles 232, an organic material pool (reservoir) 233 and a plurality of organic material passages 234 each linked between one of the pressure chambers 231 and the organic material pool 233 are partitioned by members 235, 236, 237 and 238. In this case, the member 237 serves as a vibration plate on which a plurality of actuators 239 formed by piezoelectric material sandwiched by metal electrodes. Also, an organic material inlet 237a leading to an organic material tank (not shown) is formed in the member 237.

In the organic material tank, note that organic material is immersed into solvent or is heated.

Also, each of the actuators 239 corresponds to one of the pressure chambers 231 and is driven by the control unit 4. Therefore, when the actuators 239 are driven to decrease the pressure chambers 231, organic material droplets are simultaneously ejected from the nozzles 232.

The operation of the control unit 4 of FIG. 1 is explained next with reference to FIG. 4.

First, at step 401, an initialization is carried out. That is, a flexible body 5 wound on the roll 11 is fed via the fixed stage 21 to the roll 31, so that a tension of the flexible body 5 is in an appropriate state. Note that a plurality of electroluminescent devices are being formed on the flexible body 5, and in this case, lower electrodes of each of the electroluminescent devices are equidistantly formed on the flexible body 5 in advance.

Next, at step 402, the rolls 11 and 31 are driven, so that the flexible body 5 is fed by a distance corresponding to one electroluminescent device.

Next, at step 403, the X-Y stage 22 is aligned at a specific position.

Next, at step 404, the ink jet type head 23 is operated, so that organic material droplets are simultaneously deposited on the flexible body 5.

Step 405 repeats steps 403 and 404 until the X-Y stage 22 is moved to all specific positions within one electroluminescent device. Thus, an organic material pattern is formed on one electroluminescent device.

Step 406 repeats steps 402, 403, 404 and 405 until organic material patterns are formed on all the electroluminescent devices on the flexible body 5.

Thus, the operation of the control unit 4 is completed by step 407.

Figure 4:
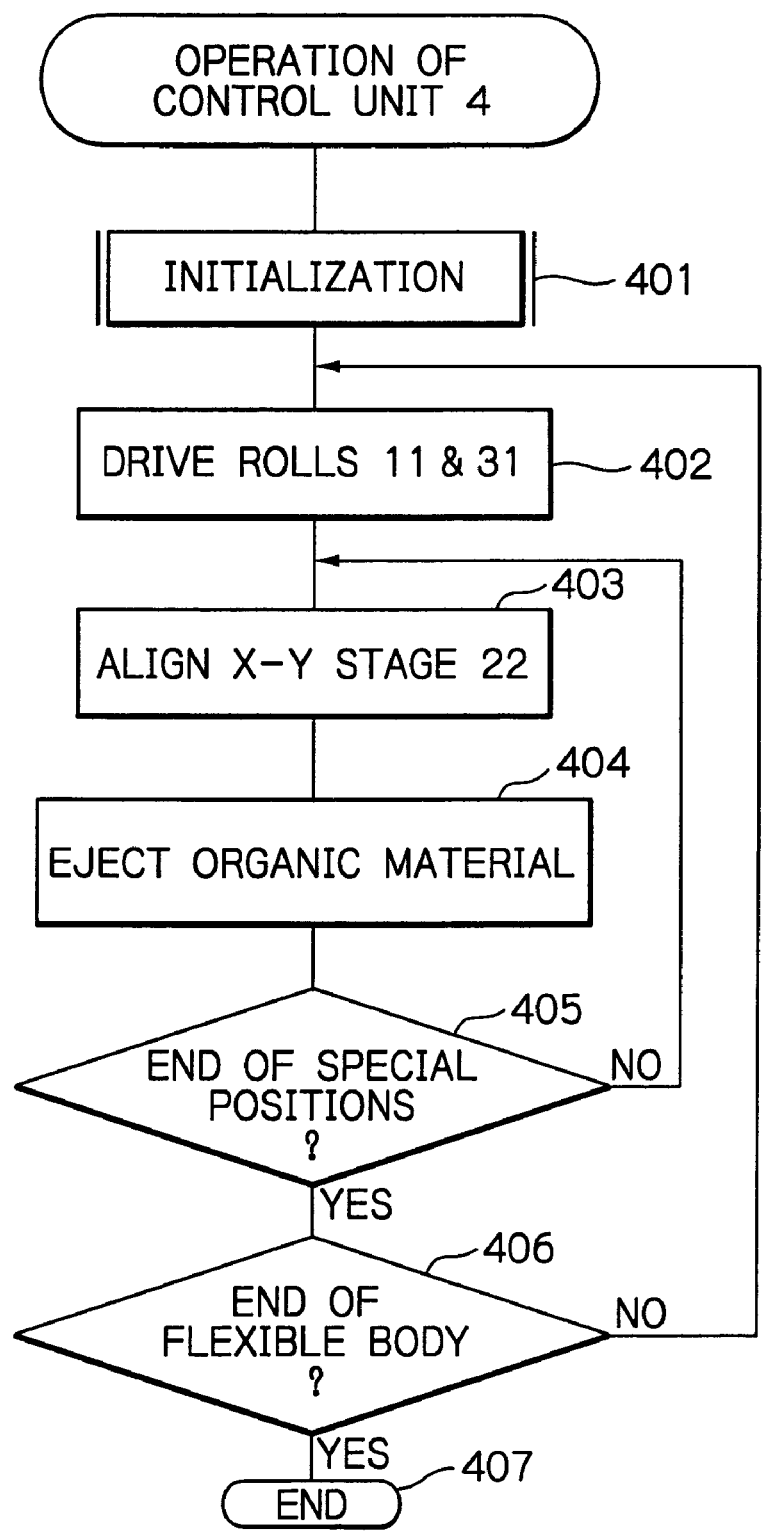
FIG. 4 is a flowchart for explaining the operation of the control unit of FIG. 1.

In FIG. 4, steps 403, 404 and 405 are used for forming a single organic structure including a light emitting layer. However, when forming a stacked organic structure including a light emitting layer and at least one of a hole-injecting and-transporting layer and an electron-injecting and-transporting layer, steps using other ink jet type heads similar to steps 403, 404 and 405 can be added to FIG. 4 for forming at least one of the hole-injecting and-transporting layer and the electron-injecting and-transporting layer.

Figure 5:
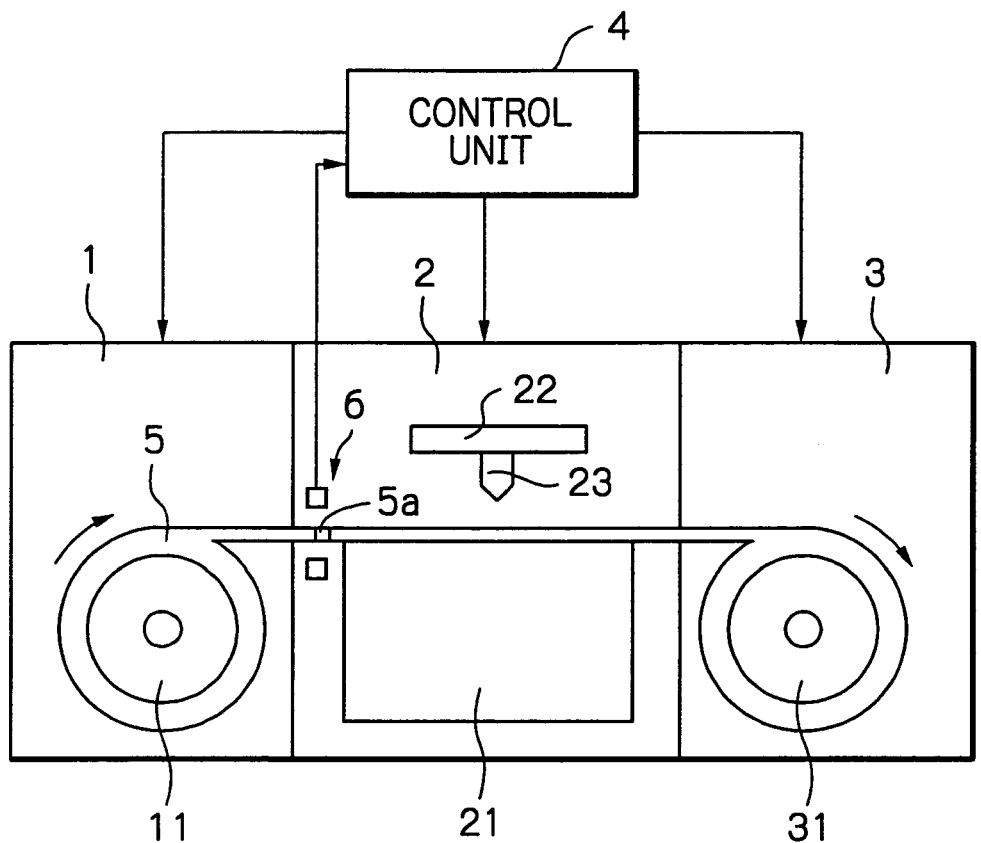
FIG. 5 is a cross-sectional view illustrating a second embodiment of the apparatus for manufacturing a flexible-type organic electroluminescent device according to the present invention.
Figure 6:
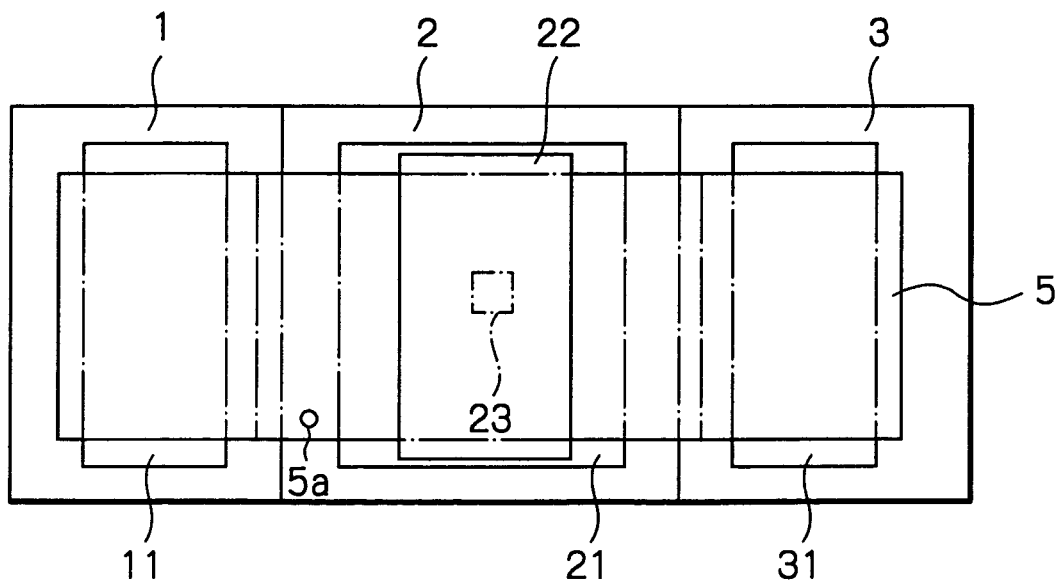
FIG. 6 is a plan view of the apparatus of FIG. 5.
Figure 7A:
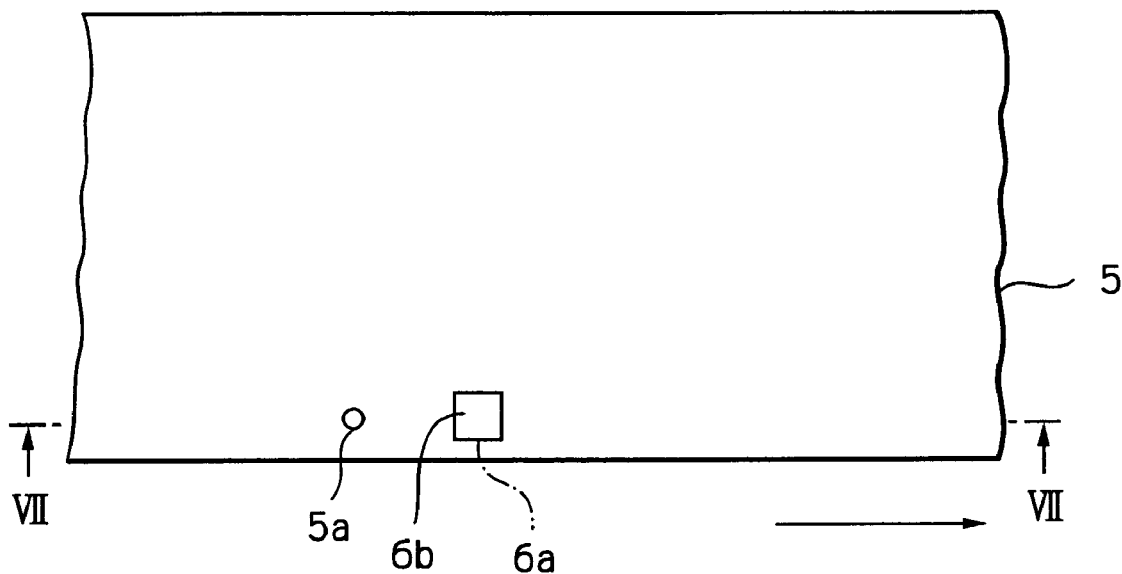
FIG. 7A is a plan view of the flexible body of FIGS. 5 and 6.
Figure 7B:
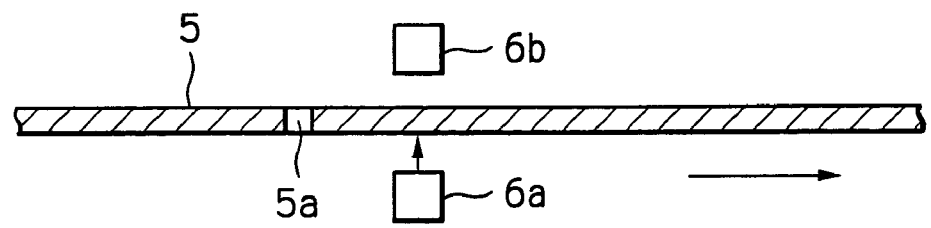
FIG. 7B is a cross-sectional view of the flexible body taken along the line VII-VII in FIG. 7A.

FIG. 5 is a cross-sectional view illustrating a second embodiment of the apparatus for manufacturing a flexible-type organic electroluminescent device according to the present invention, FIG. 6 is a plan view of the apparatus of FIG. 5, FIG. 7A is a plan view of the flexible body of FIGS. 5 and 6, and FIG. 7B is a cross-sectional view of the flexible body taken along the line VII-VII in FIG. 7A.

In FIGS. 5 and 6, one position detecting mark 5a is provided for each of the electroluminescent devices, and a position detecting sensor 6 is provided in the organic material pattern forming section 2. For example, as illustrated in FIGS. 7A and 7B, the position detecting mark 5a is a hole, and the position detecting sensor 6 is formed by a photo diode 6a and a photodetector 6b.

Figure 8:
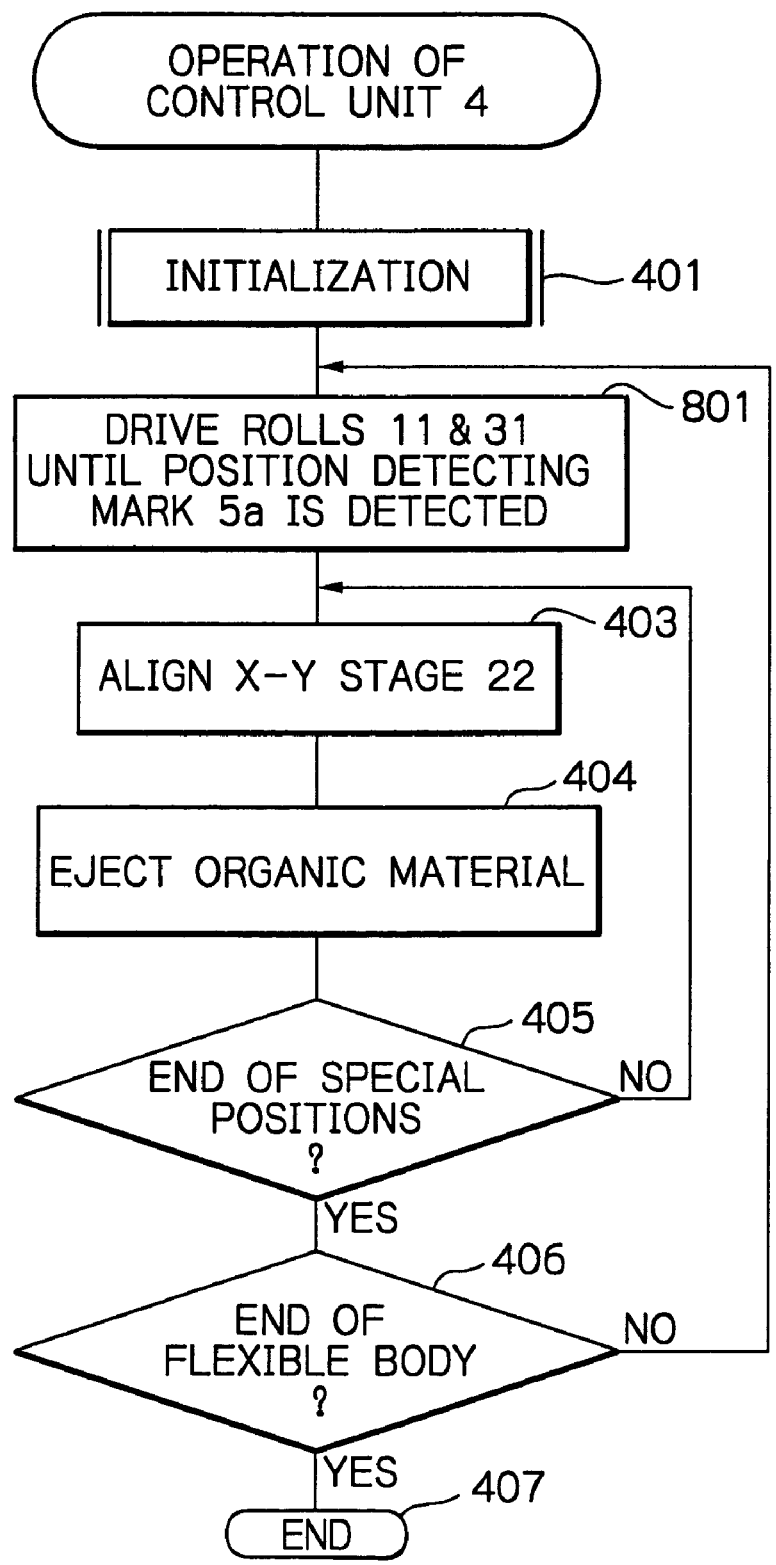
FIG. 8 is a flowchart for explaining the operation of the control unit of FIG. 5.

The operation of the control unit 4 of FIG. 5 is shown in FIG. 8, where step 402 of FIG. 4 is modified into step 801. That is, at step 801, the rolls 11 and 31 are driven until the next position detecting mark 5a is detected. As a result, the flexible body 5 is fed by a distance corresponding to one electroluminescent device. Thus, the position of the flexible body 5 can be more accurately controlled as compared with the first embodiment.

Figure 9A:
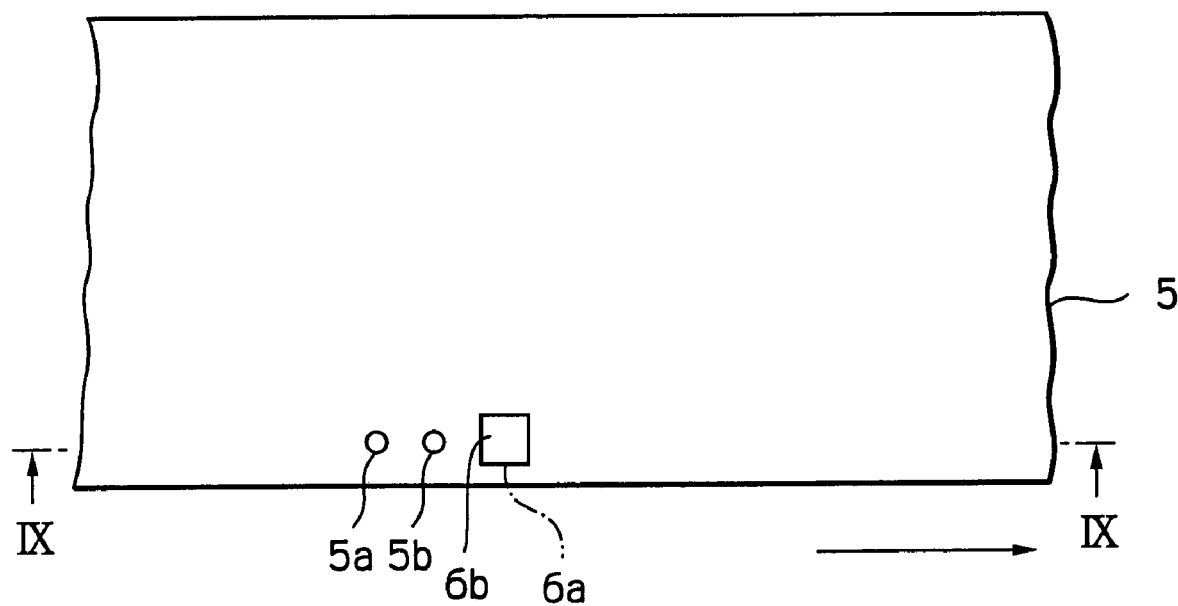
FIG. 9A is a plan view illustrating a modification of the flexible body of FIG. 7A.
Figure 9B:
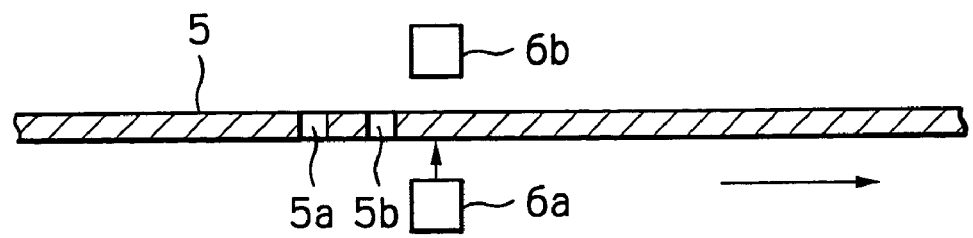
FIG. 9B is a cross-sectional view of the flexible body along the line IX-IX in FIG. 9A.
Figure 10:
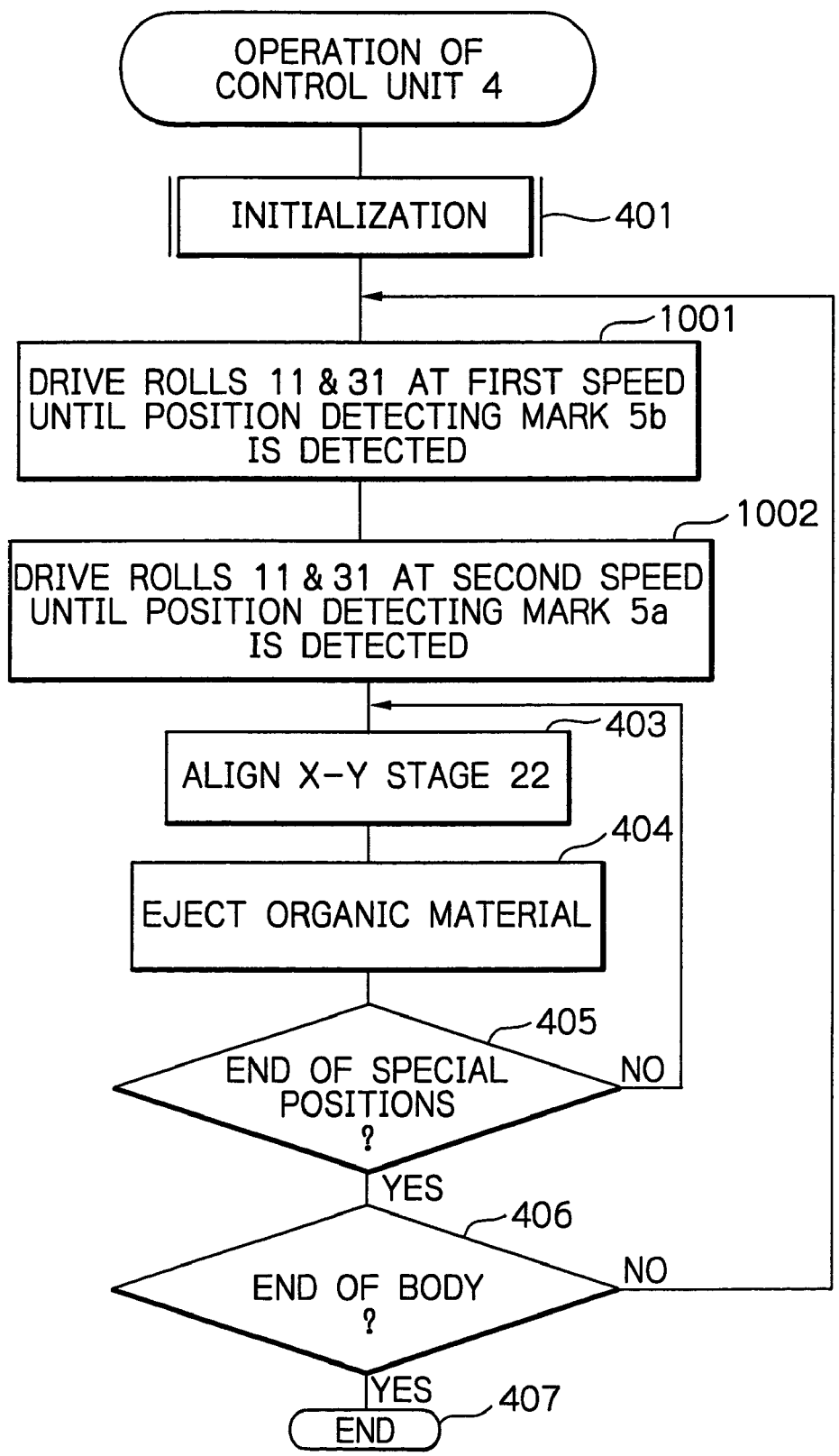
FIG. 10 is a flowchart for explaining the operation of the control unit of FIG. 5 where the modification as illustrated in FIGS. 9A and 9B is applied.

FIG. 9A illustrates a modification of FIG. 7A, and FIG. 9B is a cross-sectional view taken along the line IX-IX of FIG. 9A. In FIGS. 9A and 9B, another position detecting mark 5b is provided ahead of each position detecting mark 5a of FIGS. 7A and 7B. In this case, the operation of the control unit 4 of FIG. 5 is shown in FIG. 10, where step 402 of FIG. 4 is modified into steps 1001 and 1002. That is, at step 1001, the rolls 11 and 31 are driven at a first speed until the next position detecting mark 5b is detected. Next, at step 1002, the rolls 11 and 31 are driven at a second speed smaller than the first speed until the next position detecting mark 5a. Thus, the position of the flexible body 5 can be further accurately controlled.

In the above-described second embodiment, the location detecting sensor 6 is constructed by optical means; however, the location detecting sensor 6 can be a magnetic sensor and a magnetic medium adhered to the flexible body 5. Also, the location detecting sensor 6 can be an electrical probe and an electric medium adhered to the flexible body 5.

Figure 11:
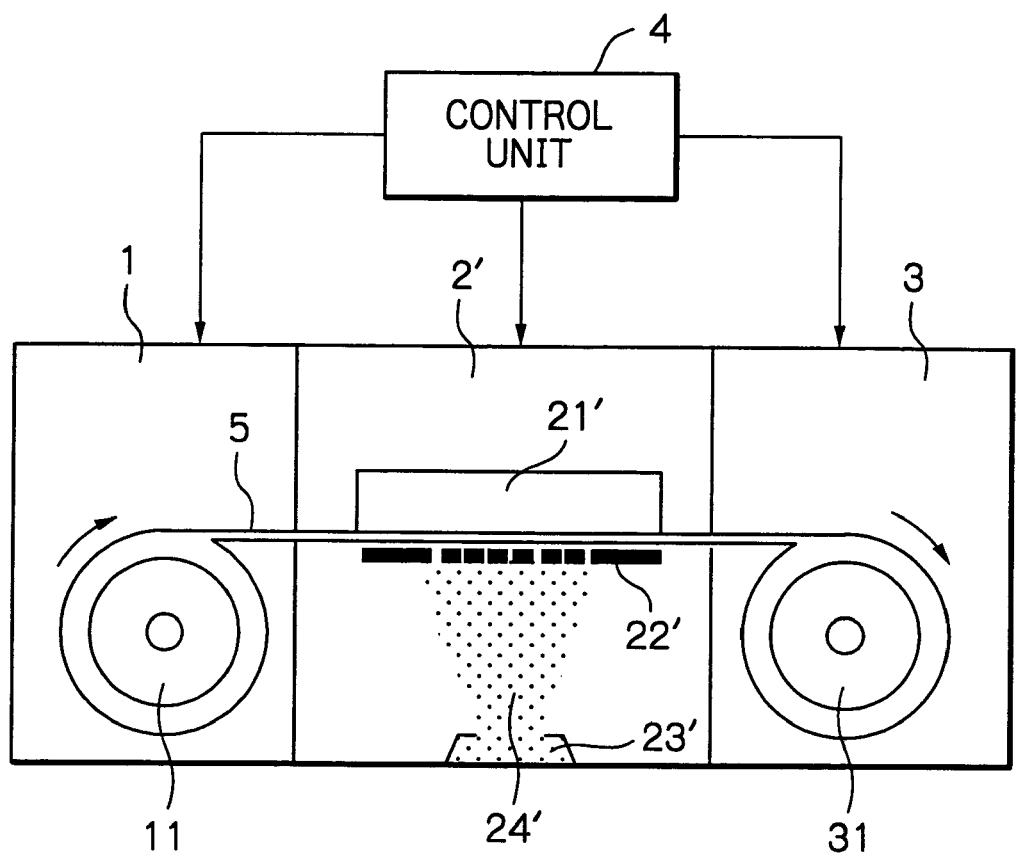
FIG. 11 is a cross-sectional view illustrating a third embodiment of the apparatus for manufacturing a flexible-type organic electroluminescent device according to the present invention.
Figure 12:
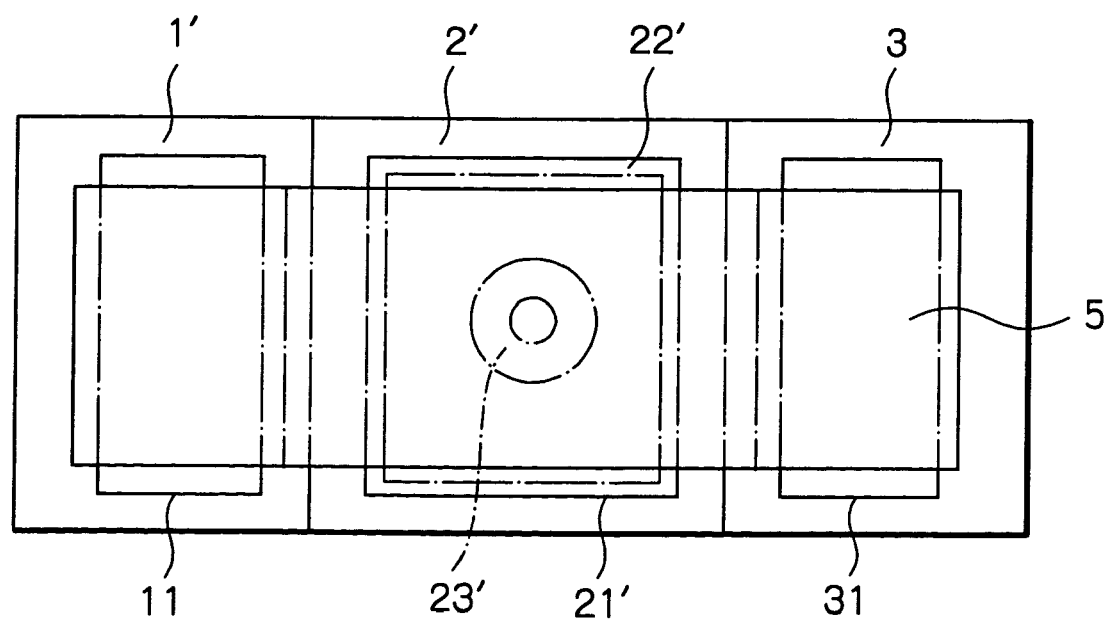
FIG. 12 is a plan view of the apparatus of FIG. 11.

FIG. 11 is a cross-sectional view illustrating a third embodiment of the apparatus for manufacturing a flexible-type organic electroluminescent device according to the present invention, and FIG. 12 is a plan view of the apparatus of FIG. 11.

In FIGS. 11 and 12, an organic material pattern forming section 2' is provided instead of the organic material pattern forming section 2 of FIGS. 1 and 2.

The organic material pattern forming section 2' is of a vacuum evaporation type constructed by a fixed stage 21' above the flexible body 5, a shadow mask 22' below the flexible body 5 and a crucible 23'. Organic material 24' in the crucible 23' is heated or irradiated by ion beams, so that organic material is evaporated and is deposited through fine holes of the shadow mask 22' to the flexible body 5.

The operation of the control unit 4 of FIG. 11 is explained next with reference to FIG. 13.

First, at step 1301, an initialization is carried out. That is, a flexible body 5 wound on the roll 11 is fed via the fixed stage 21' to the roll 31, so that a tension of the flexible body 5 is in an appropriate state. Note that a plurality of electroluminescent devices are being formed on the flexible body 5, and in this case, lower electrodes of each of the electroluminescent devices are equidistantly formed on the flexible body 5 in advance.

Next, at step 1302, the rolls 11 and 31 are driven so that the flexible body 5 is fed by a distance corresponding to one electroluminescent device.

Next, at step 1303, organic material 24' is evaporated from the crucible 23'. As a result, an organaic material pattern is formed through the shadow mask 22' on one electroluminescent device.

Step 1304 repeat steps 1302 and 1303 until organic material patterns are formed on all the electroluminescent devices on the flexible body 5.

Thus, the operation of the control unit 4 is completed by step 1305.

Figure 13:
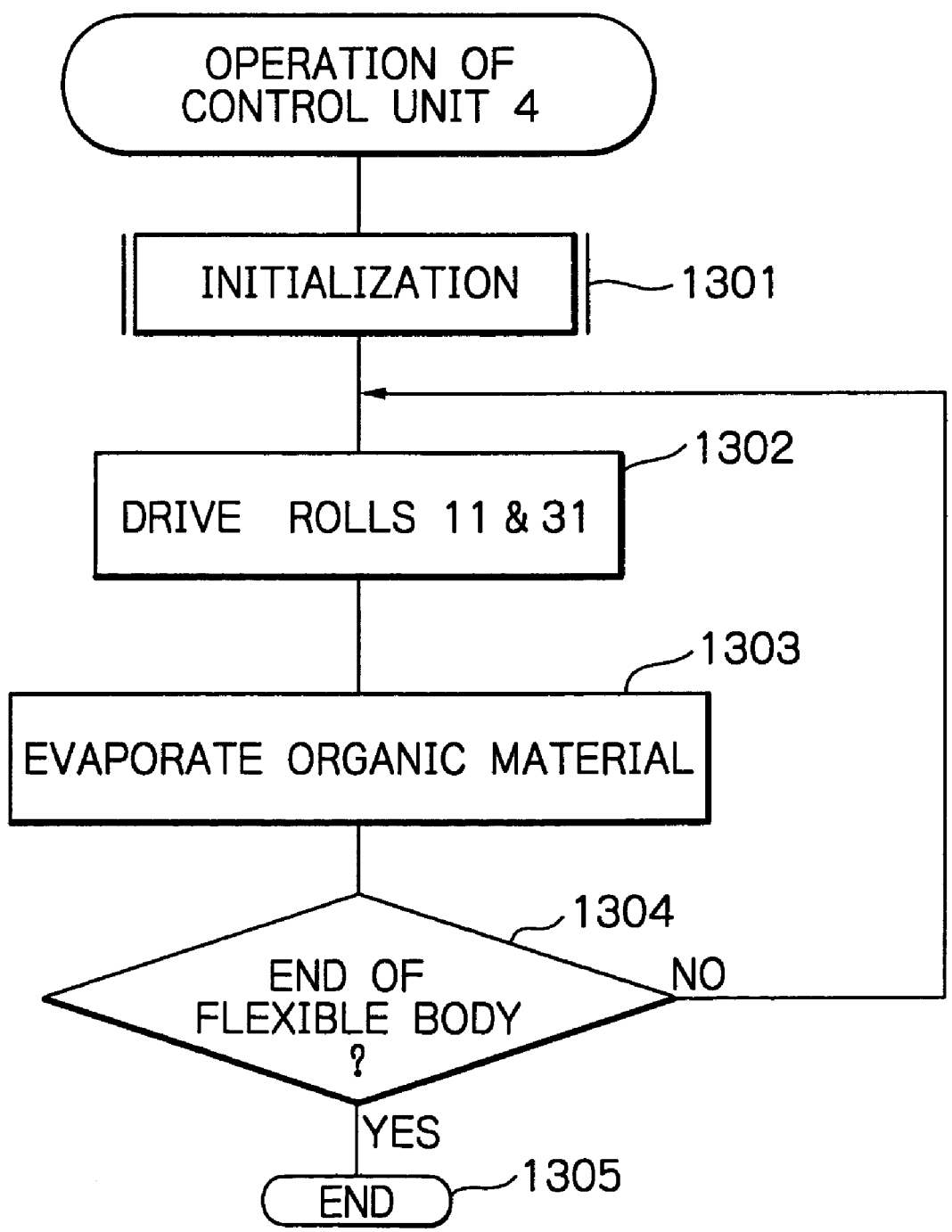
FIG. 13 is a flowchart for explaining the operation of the control unit of FIG. 11.

Even in FIG. 13, steps 1303, 1304 and 1305 are used for forming a single organic structure including a light emitting layer. However, when forming a stacked organic structure including a light emitting layer and at least one of a hole-injecting and-transporting layer and an electron-injecting and-transporting layer, steps using other crucibles similar to step 1303 can be added to FIG. 13 for forming at least one of the hole-injecting and-transporting layer and the electron-injecting and-transporting layer.

Note that the above-described more accurate control of the flexible body 5 as illustrated in the second embodiment and its modification can be applied to the third embodiment. Also, in the third embodiment, a sputtering method can be used instead of a vacuum evaporation method.

Figure 14:
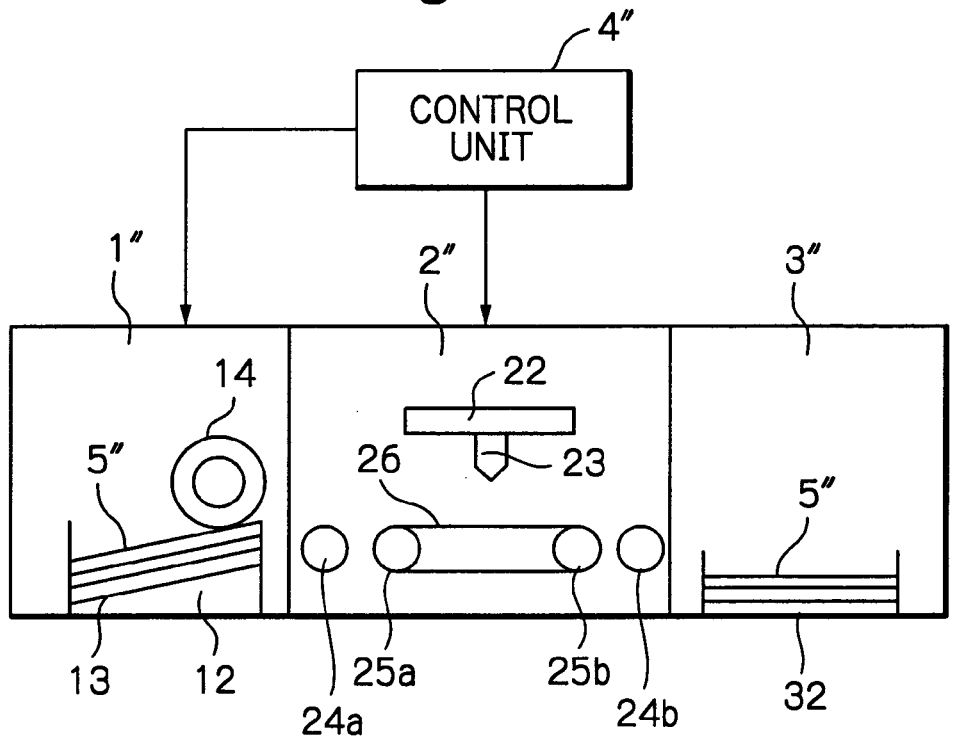
FIG. 14 is a cross-sectional view illustrating a fourth embodiment of the apparatus for manufacturing a flexible-type organic electroluminescent device according to the present invention.

In FIG. 14, which is a cross-sectional view illustrating a fourth embodiment of the apparatus for manufacturing a flexible-type organic electyroluminescent device according to the present invention, reference numeral 1" designates a flexible body supplying section to which a cassette case 12 is fixed. The cassette case 12 stores a plurality of flexible bodies 5" each corresponding to one electroluminescent device, The flexible bodies 5" is pushed up by a pushing plate 13 toward a pickup roller 14. When the pickup roller 14 is rotated, only an uppermost one of flexible bodies 5" is fed to an organic material pattern forming section In the organic material pattern forming section 2", carrier rollers 24a and 24b, and drive rollers 25a and 25b for driving a belt 26 are provided instead of the fixed stage 21 of FIG. 1. After an organic material pattern is formed on one of the flexible bodies 5", each of the flexible bodies 5" is fed to a flexible body receiving section 3".

In the flexible body receiving section 3", a tray 32 for receiving the flexible bodies 5" is provided instead of the roll 31 of FIG. 1.

The flexible body supplying section 1" and the organic material pattern forming section 2" are controlled by a control unit 4.

Figure 15:
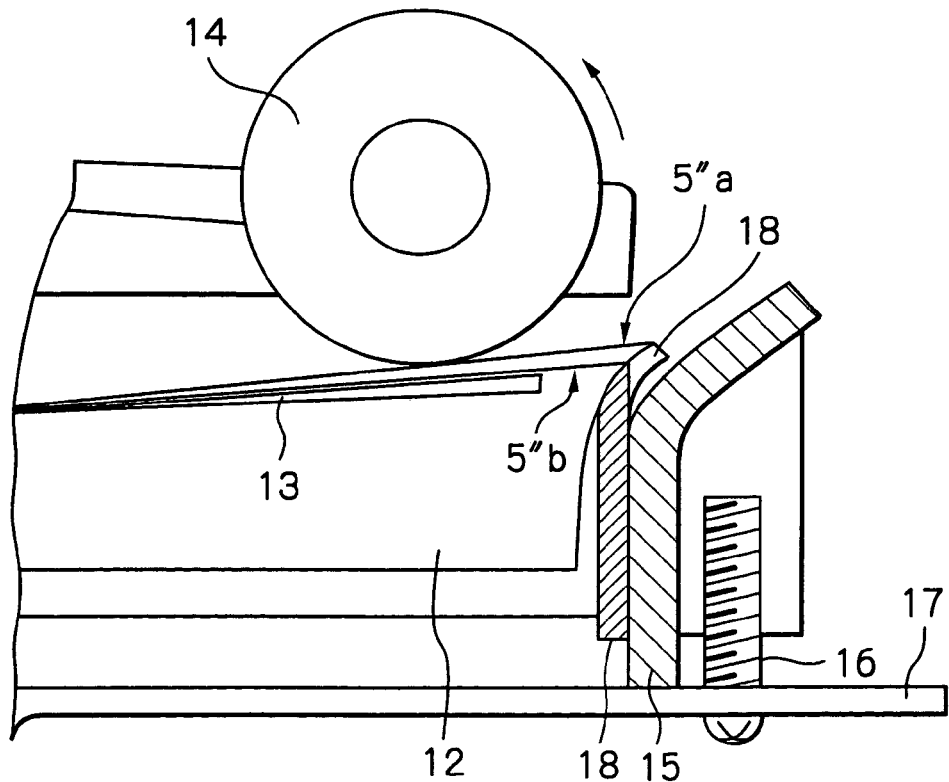
FIG. 15 is a partially-cut cross-sectional view of the flexible body supplying section of FIG. 14.

In FIG. 15, which is a partially-cut cross-sectional view of the flexible body supplying section 1" of FIG. 14, a base wall 15 is fixed by a screw 16 to a base 17, thus holding the cassette case 12. Also, a pair of separating plates 18 are provided between the base wall 15 and the cassette case 12. Therefore, when the pickup roller 14 is rotated as indicated by an arrow, only an uppermost flexible body 5"a is fed by a friction between the pickup roller 14 and the flexible body 5"a goes over the separating plates 18, but the next uppermost flexible 5"b abuts against the edge of the separating plates 18. Thus, a double feeding operation of flexible bodies 5" can be avoided.

The operation of the control unit 4", of FIG. 14 is explained next with reference to FIG. 16.

First, at step 1601, an initialization is carried out. That is, flexible bodies 5" are mounted in the cassette case 12, which is then set in the flexible body receiving section 1". Note that a plurality of electroluminescent devices are being formed on each of the flexible bodies 5", and in this case, lower electrodes are formed on each of the flexible bodies 5" in advance.

Next, at step 1602, the pickup roller 14 and the driving rollers 25a and 25b are driven, so that an uppermost one of the flexible bodies 5' is fed to the belt 26.

Next, at step 1603, the X-Y stage 22 is aligned at a specific position.

Next, at step 1604, the ink jet type head 23 is operated, so that organic material droplets are simultaneously deposited on one of the flexible bodies 5" on the belt 26.

Step 1605 repeats steps 1603 and 1604 until the X-Y stage 22 is moved to all specific positions within the one of the flexible bodies 5". Thus, an organic material pattern is formed on the one of the flexible bodies 5".

Next, at step 1606, the driving rollers 25a and 25b are driven, so that the one of the flexible bodies 5" on the belt 26 is fed to the tray 32 of the flexible body receiving section 3".

Step 1607 repeats steps 1602, 1603, 1604, 1605 and 1606 until organic material patterns are formed on all the flexible bodies 5".

Thus, the operation of the control unit 4" is completed by step 1608.

Figure 16:
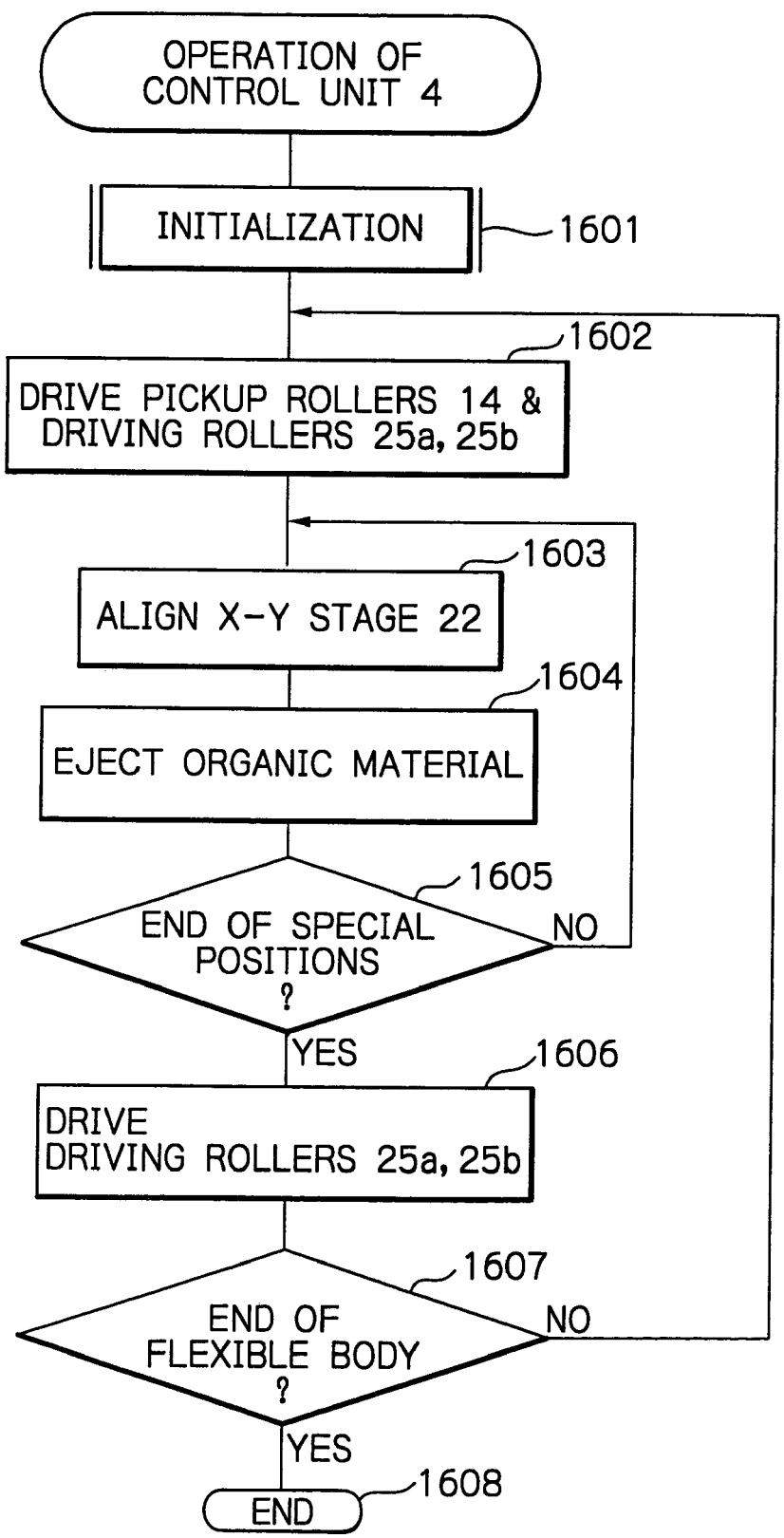
FIG. 16 is a flowchart for explaining the operation of the control unit of FIG. 14.

Even in FIG. 16, steps 1603, 1604 and 1605 are used for forming a single organic structure including a light emitting layer. However, when forming a stacked organic structure including a light emitting layer and at least one of a hole-injecting and-transporting layer and an electron-injecting and-transporting layer, steps using other ink jet type heads similar to steps 1603, 1604 and 1605 can be added to FIG. 16 for forming at least one of the hole-injecting and-transporting layer and the electron-injecting and-transporting layer.

The inventors produced a single matrix type organic electroluminescent device of 2 inches (5.08 cm)×2 inches (5.08 cm) having a pixel size of 300 µm×300 µm using the first embodiment as illustrated in FIGS. 1, 2, 3 and 4. First, lower electrodes made of 1 µm thick Al and 50 nm thick Au were formed on a flexible substrate made of polyimide resin. Next, in the apparatus of FIGS. 1, 2 and 3 where the number of the nozzles 232 is 10, 4 pl polytiophene solution droplets were deposited on the flexible substrate, and then, 4 pl polyphenylenevinylene solution droplets were deposited thereon. Next, upper electrodes made of 5 nm thick Cu and 50 nm thick ITO were deposited, and then, an 1 µm thick protection layer made of $Al_2O_3$ and $SiO_2$ was deposited. As a result, the produced single matrix type organic electroluminescent device exhibited a brightness of about 100 cd. Also, no electrical and mechanical destruction by the apparatus of FIGS. 1, 2 and 3 was observed in the produced single matrix type organic electroluminescent device.

In the above-described embodiments, the flexible substrate (body) is a single film or a multiple film made of aromatic polyamide resin, polyimide resin and polyester, a thin metal alloy film, or a stacked structure of a metal film and a resin film.

As explained hereinabove, according to the present invention, a novel method and apparatus for manufacturing a flexible electroluminescent device can be realized.

The invention claimed is:

1. A method for manufacturing a flexible-type luminescent device, comprising the steps of:
supplying a flexible body from a flexible body supplying section to a luminescent material pattern forming section on a luminescent device-to-luminescent device basis;
forming a luminescent material pattern on said flexible body in said luminescent material pattern forming section; and
feeding said flexible body from said luminescent material pattern forming section to a flexible body receiving section on a luminescent device-to-luminescent device basis
wherein said flexible body is wound on a first roll in said flexible body supplying section and said flexible body receiving section comprises a second roll, and
wherein said flexible body supplying step comprises;
feeding said flexible body a distance corresponding to one said luminescent device by driving said first and second rolls at a first speed until a first position detecting mark is detected on said flexible body and driving said first and second rolls at a second speed smaller than said first speed after said first position detecting mark is detected and before a second position detecting mark is detected on said flexible body.

2. The method as set forth in claim 1, wherein said luminescent material pattern forming step comprises the steps of;
aligning a luminescent material ejecting apparatus at one of specific positions;
operating said luminescent material ejecting apparatus after said luminescent material ejecting apparatus is aligned at the one of specific positions; and
repeating said luminescent material ejecting apparatus aligning step and said luminescent material ejecting apparatus operating step for all said specific positions.

3. The method as set forth in claim 2, wherein said luminescent material ejecting apparatus comprises an ink jet type head having a nozzle for ejecting luminescent material.

4. The method as set forth in claim 1, wherein said luminescent material pattern forming step comprises a step of vacuum-evaporating luminescent material and depositing said luminescent material through a shadow mask having holes onto said flexible body.

5. The method as set forth in claim 1, wherein said luminescent material pattern forming step comprises a step of depositing luminescent material through a shadow mask having holes to said flexible body by a sputter process.

6. The method as set forth in claim 1, wherein said luminescent device comprises a flexible-type organic electroluminescent device.

7. A method for manufacturing a flexible-type luminescent device, comprising the steps of:
supplying a flexible body from a flexible body supplying section to a luminescent material pattern forming section on a luminescent device-to-luminescent device basis;
forming a luminescent material pattern on said luminescent device of said flexible body by using an ink jet type head having nozzles for ejecting luminescent material in said luminescent material pattern forming section; and
feeding said flexible body from said luminescent material pattern forming section to a flexible body receiving section on a luminescent device to luminescent device basis,
wherein said flexible body is wound on a first roll in said flexible body supplying section and said flexible body receiving section comprises a second roll, and
wherein said flexible body supplying step comprises:
feeding said flexible body a distance corresponding to one said luminescent device by driving said first and second rolls at a first speed until a first position detecting mark is detected on said flexible body and driving said first and second rolls at a second speed smaller than said first speed after said first position detecting mark is detected and before a second position detecting mark is detected on said flexible body.

8. A method for manufacturing a flexible-type luminescent device, comprising the steps of:
supplying a flexible body from a flexible body supplying section to a luminescent material pattern forming section on a luminescent device-to-luminescent device basis;
forming a luminescent material pattern on said luminescent device of said flexible body by a vacuum evaporation process using a shadow mask having holes in said luminescent material pattern forming section; and
feeding said flexible body from said luminescent material pattern forming section to a flexible body receiving section on a luminescent device-to-luminescent device basis,
wherein said flexible body is wound on a first roll in said flexible body supplying section and said flexible body receiving section comprises a second roll, and
wherein said flexible body supplying step comprises
feeding said flexible body a distance corresponding to one said luminescent device by driving said first and second rolls at a first speed until a first position detecting mark is detected on said flexible body and driving said first and second rolls at a second speed smaller than said first speed after said first position detection mark is detected and before a second position detecting mark is detected on said flexible body.

9. A method for manufacturing a flexible-type luminescent device, comprising the steps of:

supplying a flexible body from a flexible body supplying section to a luminescent material pattern forming section on a luminescent device-to-luminescent device basis;

forming a luminescent material pattern on said luminescent device of said flexible body by a sputter process using a shadow mask having holes in said luminescent material pattern forming section; and feeding said flexible body from said luminescent material pattern forming section to a flexible body receiving section on a luminescent device-to-luminescent device basis, wherein said flexible body is wound on a first roll in said flexible body supplying section and said flexible body receiving section comprises a second roll, and wherein said flexible body supplying step comprises:

feeding said flexible body a distance corresponding to one said luminescent device by driving said first and second rolls at a first speed until a first position detecting mark is detected on said flexible body and driving said first and second rolls at a second speed smaller than said first speed after said first position detecting mark is detected and before a second position detecting mark is detected on said flexible body.

* * * * *